US012787826B2

(12) United States Patent
Yen et al.

(10) Patent No.: US 12,787,826 B2
(45) Date of Patent: Nov. 3, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Chung-Chih Yen, Taichung City (TW); Kuo-Hui Wan, Taichung City (TW); Chun-Chu Lai, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 350 days.

(21) Appl. No.: 18/650,664

(22) Filed: Apr. 30, 2024

(65) Prior Publication Data

US 2025/0174540 A1 May 29, 2025

(30) Foreign Application Priority Data

Nov. 27, 2023 (TW) ................................ 112145871

(51) Int. Cl.

*H01L 23/498* (2006.01)
*H01L 21/48* (2006.01)
*H01L 23/00* (2006.01)
*H01L 23/31* (2006.01)
*H01L 25/10* (2006.01)

(Continued)

(52) U.S. Cl.

CPC ........... *H10W 70/65* (2026.01); *H10W 20/20* (2026.01); *H10W 70/095* (2026.01); *H10W 74/117* (2026.01); *H10W 90/00* (2026.01); *H10W 70/60* (2026.01); *H10W 72/252* (2026.01);

(Continued)

(58) Field of Classification Search

CPC ... H10W 72/252; H10W 72/20; H10W 90/00; H10W 90/724; H10W 90/734; H10W 90/722; H10W 90/401; H10W 90/701; H10W 74/117; H10W 74/10; H10W 74/15; H10W 70/65; H10W 70/095; H10W 70/05; H10W 70/60; H10W 70/611; H10W 70/614; H10W 20/20; H10W 20/43; H10W 20/083; H10W 20/497; H10W 20/063; H10W 70/40; H10W 72/74;

(Continued)

(56) References Cited

U.S. PATENT DOCUMENTS 11,289,346 B2 * 3/2022 Huang .................... H10P 72/74
2020/0335447 A1 * 10/2020 Huang .................... H10P 72/74

* cited by examiner

*Primary Examiner* — Nikolay K Yushin
(74) *Attorney, Agent, or Firm* — Dority & Manning, PA

(57) ABSTRACT

An electronic package and a manufacturing method thereof are provided, in which at least one groove and a plurality of openings are formed on a first side of a carrier member, a plurality of conductive pillars are formed in the plurality of openings, a first electronic element is accommodated in the groove, a plurality of conductive elements are formed on a second side of the carrier member and electrically connected to the plurality of conductive pillars and the first electronic element, and a circuit structure is formed on the first side of the carrier member and electrically connected to the plurality of conductive pillars and the first electronic element. Therefore, a board body made of semiconductor material serves as the carrier member, so that the coefficient of thermal expansion (CTE) of the carrier member matches the CTE of the first electronic element, which is beneficial to dispersing thermal stress.

13 Claims, 7 Drawing Sheets

(51) Int. Cl.
*H10W 20/20* (2026.01)
*H10W 70/05* (2026.01)
*H10W 70/65* (2026.01)
*H10W 74/10* (2026.01)
*H10W 90/00* (2026.01)
*H10W 70/60* (2026.01)
*H10W 72/20* (2026.01)
*H10W 74/15* (2026.01)

(52) U.S. Cl.
CPC ............ *H10W 74/10* (2026.01); *H10W 74/15* (2026.01); *H10W 90/724* (2026.01); *H10W 90/734* (2026.01)

(58) Field of Classification Search
CPC ...... H10W 72/072; H10P 72/74; H10P 72/70; H10P 72/0421; H10P 72/7424; H10P 72/743
See application file for complete search history.

ELECTRONIC PACKAGE AND MANUFACTURING METHOD THEREOF

CROSS-REFERENCE TO RELATED APPLICATIONS

The present application is based upon and claims the right of priority to TW patent application No. 112145871, filed Nov. 27, 2023, the disclosure of which is hereby incorporated by reference herein in its entirety for all purposes.

BACKGROUND

1. Technical Field

The present disclosure relates to a semiconductor device, and more particularly, to an electronic package that can reduce energy consumption and a manufacturing method thereof.

2. Description of Related Art

In order to ensure the continued miniaturization and multi-functionality of electronic products and communication equipment, semiconductor packaging needs to develop towards miniaturization and high functionality. For example, in advanced process packaging, commonly used packaging types include 2.5 D packaging process, Fan-Out Embedded Bridge (FO-EB), and the like, wherein FO-EB has the advantages of low cost and multiple material suppliers compared to the 2.5 D packaging process.

FIG. 1 is a schematic cross-sectional view of a conventional FO-EB semiconductor package 1. In the semiconductor package 1, a first semiconductor chip 11 and a plurality of conductive pillars 13 are disposed on a circuit structure 14 having a circuit layer 141, wherein the first semiconductor chip 11 and the conductive pillars 13 are covered with a first encapsulation layer 15, a circuit structure 10 is formed on the first encapsulation layer 15 and electrically connected to the first semiconductor chip 11 and the conductive pillars 13, a plurality of second semiconductor chips 16 are disposed on and electrically connected to the circuit structure 10, and the second semiconductor chips 16 are covered with a second encapsulation layer 18, and wherein the conventional semiconductor package 1 mainly uses the circuit structure 14 to be connected to a circuit board (not shown) via a plurality of conductive elements 17.

However, in the conventional semiconductor package 1, a mismatch between the coefficient of thermal expansion (CTE) of the first encapsulation layer 15 and the CTE of the first semiconductor chip 11 can easily lead to uneven thermal stress, resulting in that the first encapsulation layer 15 warps during a thermal cycle, thereby causing the semiconductor package 1 (especially the first semiconductor chip 11 and the second semiconductor chips 16) to crack. In addition, during the aforementioned manufacturing process, due to the uneven surface of the first encapsulation layer 15, it is easy to cause difficulty in the subsequent manufacturing process.

Therefore, how to overcome the above-mentioned problems of the prior art has become an urgent issue to be solved.

SUMMARY

In view of the various deficiencies of the prior art, the present disclosure provides an electronic package, which comprises: a carrier member having a first side and a second side opposing the first side, wherein the carrier member is formed with a groove and a plurality of openings, and the groove and the plurality of openings communicate with the first side and the second side; a plurality of conductive pillars disposed in the plurality of openings; a first electronic element disposed in the groove; a plurality of conductive elements disposed on the second side of the carrier member and electrically connected to the plurality of conductive pillars and the first electronic element; and a circuit structure disposed on the first side of the carrier member and electrically connected to the plurality of conductive pillars and the first electronic element.

The present disclosure also provides a method of manufacturing an electronic package, the method comprises: providing a carrier member having a first side and a second side opposing the first side, wherein the first side of the carrier member is formed with a groove and a plurality of openings, and a bottom surface of the groove and bottom surfaces of the plurality of openings have a plurality of recesses; forming a plurality of conductive elements in the plurality of recesses, forming a plurality of conductive pillars in the plurality of openings, and placing a first electronic element in the groove, wherein the plurality of conductive elements are electrically connected to the plurality of conductive pillars and the first electronic element; forming a circuit structure on the first side of the carrier member, wherein the circuit structure is electrically connected to the plurality of conductive pillars and the first electronic element; and removing part of material on the second side of the carrier member to expose the plurality of conductive elements, wherein the groove and the plurality of openings communicate with the first side and the second side.

The present disclosure further provides a method of manufacturing an electronic package, the method comprises: providing a carrier member having a first side and a second side opposing the first side, wherein the first side of the carrier member is formed with a groove and a plurality of openings; forming a plurality of conductive pillars in the plurality of openings, and placing a first electronic element in the groove; forming a circuit structure on the first side of the carrier member, wherein the circuit structure is electrically connected to the plurality of conductive pillars and the first electronic element; removing part of material of the second side of the carrier member to expose the conductive pillars and the first electronic element, wherein the groove and the plurality of openings communicate with the first side and the second side; and forming a plurality of conductive elements on the conductive pillars and the first electronic element, wherein the plurality of conductive elements are electrically connected to the plurality of conductive pillars and the first electronic element.

In the aforementioned electronic package and method, the carrier member is a board body made of a semiconductor material.

In the aforementioned electronic package and method, the first electronic element includes an electronic body of a silicon substrate.

In the aforementioned electronic package and method, the present disclosure further comprises disposing at least one second electronic element on the circuit structure, wherein the at least one second electronic element is electrically connected to the circuit structure. Further, the present disclosure may comprise covering the at least one second electronic element with an encapsulation layer.

As can be seen from the above, in the electronic package and the manufacturing method thereof of the present disclosure, the carrier member is designed in such a way that the coefficient of thermal expansion (CTE) of the carrier member matches the coefficient of thermal expansion of the first electronic element, which is beneficial to dispersing thermal stress. Therefore, compared with the prior art, the present disclosure can prevent the carrier member from warping during the thermal cycle, thereby preventing the electronic package from being broken.

DETAILED DESCRIPTION

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2F are schematic cross-sectional views illustrating a manufacturing method of an electronic package 2 according to a first embodiment of the present disclosure.

Figure 1:
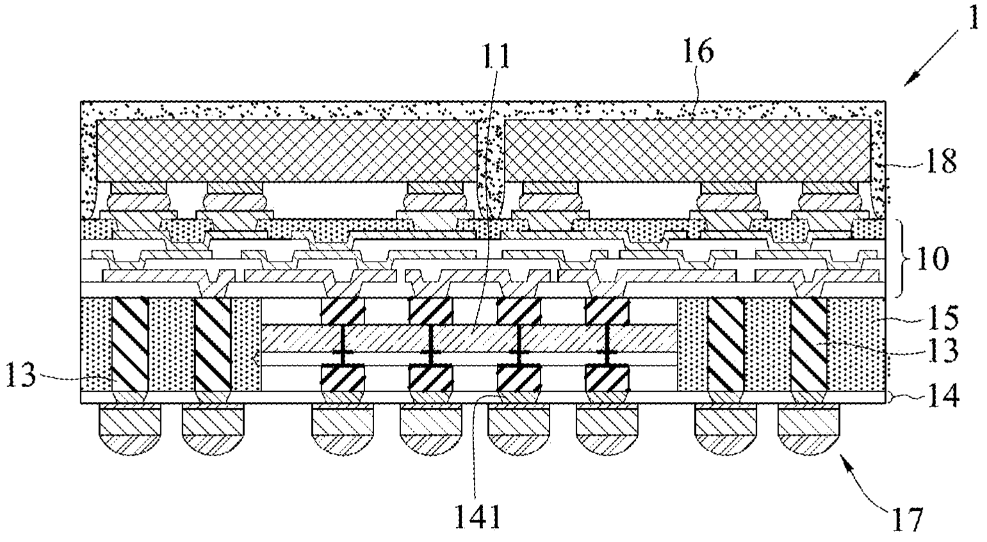
FIG. 1 (PRIOR ART)
FIG. 1 is a schematic cross-sectional view of a conventional semiconductor package.
Figure 2A:
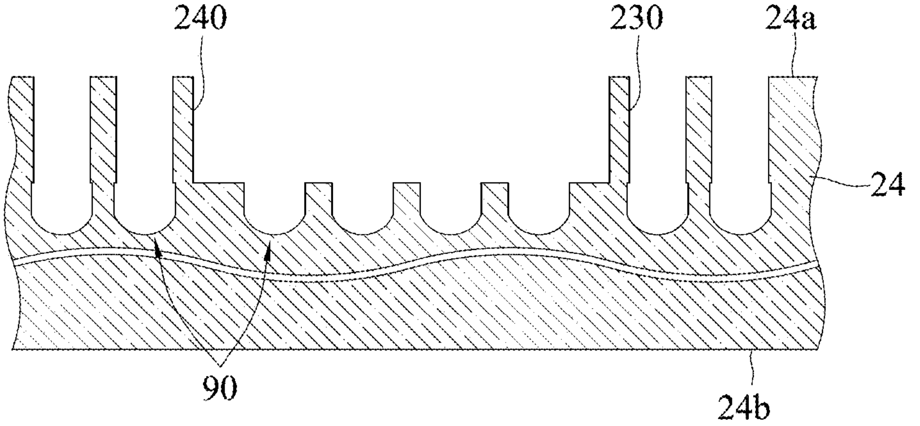
FIG. 2A to FIG. 2F are schematic cross-sectional views illustrating a manufacturing method of an electronic package according to a first embodiment of the present disclosure.

As shown in FIG. 2A, a carrier member 24 is provided, and the carrier member 24 has at least one groove 240 and a plurality of openings 230, wherein the bottom surface of the groove 240 and the bottom surfaces of the plurality of openings 230 have a plurality of recesses 90.

In one embodiment, the carrier member 24 is, for example, a board body made of semiconductor material (such as silicon or glass), and the carrier member 24 has a first side 24*a* and a second side 24*b* opposing the first side 24*a*, so that the groove 240 and the openings 230 are formed on the first side 24*a*. For example, the groove 240, the recesses 90 and the openings 230 can be formed by etching or laser, so that the groove 240, the recesses 90 and the openings 230 do not penetrate through the carrier member 24.

Figure 2B:
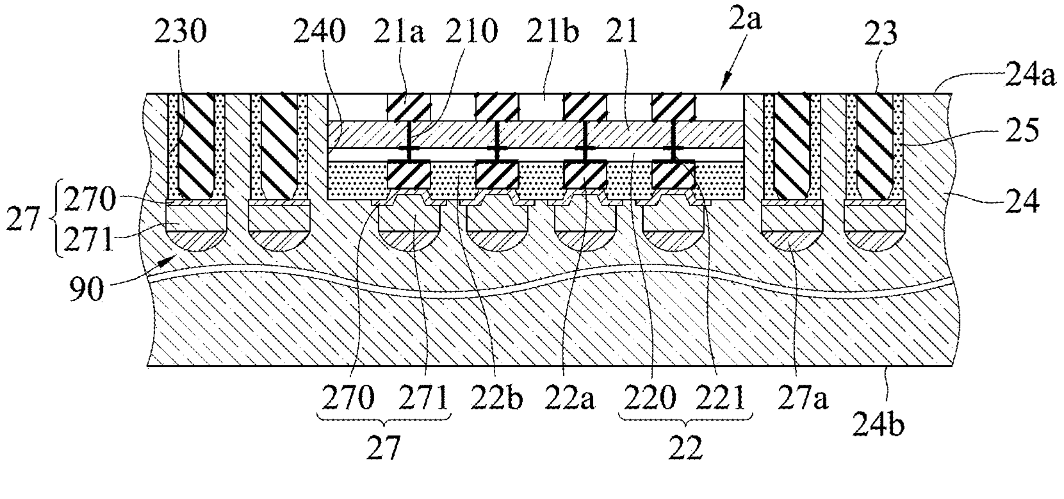

As shown in FIG. 2B, a plurality of conductive elements 27 are formed in the plurality of recesses 90, and a plurality of conductive pillars 23 are formed in the plurality of openings 230, and at least one first electronic element 2*a* is accommodated in the groove 240.

The first electronic element 2*a* includes an electronic body 21, a circuit portion 22, a plurality of first conductors 21*a* formed on the electronic body 21, and a plurality of second conductors 22*a* formed on the circuit portion 22 and electrically connected to the circuit portion 22, wherein the circuit portion 22 of the first electronic element 2*a* is correspondingly accommodated in the groove 240.

In one embodiment, the electronic body 21 is made of a silicon substrate or silicon base material and is such as a semiconductor chip, and the electronic body 21 has a plurality of conductive vias 210 (such as through-silicon vias [TSVs]) penetrating through the electronic body 21 so as to electrically connect the circuit portion 22 and the plurality of first conductors 21*a*. For example, the circuit portion 22 includes at least one passivation layer 220 and conductive traces 221 bonded to the passivation layer 220, so that the conductive traces 221 electrically connect the conductive vias 210 and the plurality of second conductors 22*a*. It should be understood that there are many types of element structures having the conductive vias 210 and are not particularly limited.

Moreover, the first conductors 21*a* and the second conductors 22*a* are metal pillars such as copper pillars, and a first protective layer 21*b* is formed on the electronic body 21, wherein the first protective layer 21*b* covers the first conductors 21*a*, and a second protective layer 22*b* is formed on the circuit portion 22, and wherein the second protective layer 22*b* covers the second conductors 22*a*, so that the first electronic element 2*a* is bonded to the carrier member 24 via the second protective layer 22*b* thereon. For example, the first protective layer 21*b* is made of an insulating film or polyimide (PI) material, and the second protective layer 22*b* is made of non-conductive film (NCF) or other materials that are easy to adhere to the carrier member 24.

The conductive pillars 23 are made of metal material such as copper or solder material, and the conductive pillars 23 can be formed by electroplating or other methods.

In one embodiment, a cladding layer 25 can be formed on the wall surfaces of the openings 230 first, so that the cladding layer 25 covers the conductive pillars 23. For example, the cladding layer 25 is made of insulating material, such as polyimide (PI), dry film, encapsulation colloid such as epoxy resin, or molding compound.

The plurality of conductive elements 27 are electrically connected to the conductive pillars 23 and the second conductors 22*a* of the first electronic element 2*a*.

In one embodiment, each of the conductive elements 27 includes a metal body 270 such as an under-bump metallurgy (UBM) layer or wiring layer, and a metal pillar 271 (such as a copper pillar) bonded to the metal body 270, so that a solder material 27*a* such as a solder bump or a solder ball is formed on the end surface of the metal pillar 271, wherein the metal bodies 270 are used to contact the second conductors 22*a* in one aspect of the metal bodies 270, and the metal bodies 270 are used to contact the conductive pillars 23 in another aspect of the metal bodies 270.

Furthermore, some of the conductive elements 27 can be formed on the first electronic element 2*a* first, and then the conductive elements 27 of the first electronic element 2*a* can be inserted into the recesses 90. Alternatively, all of the conductive elements 27 are formed in the recesses 90, and then the second conductors 22*a* of the first electronic element 2*a* are electrically connected to the conductive elements 27.

Figure 2C:
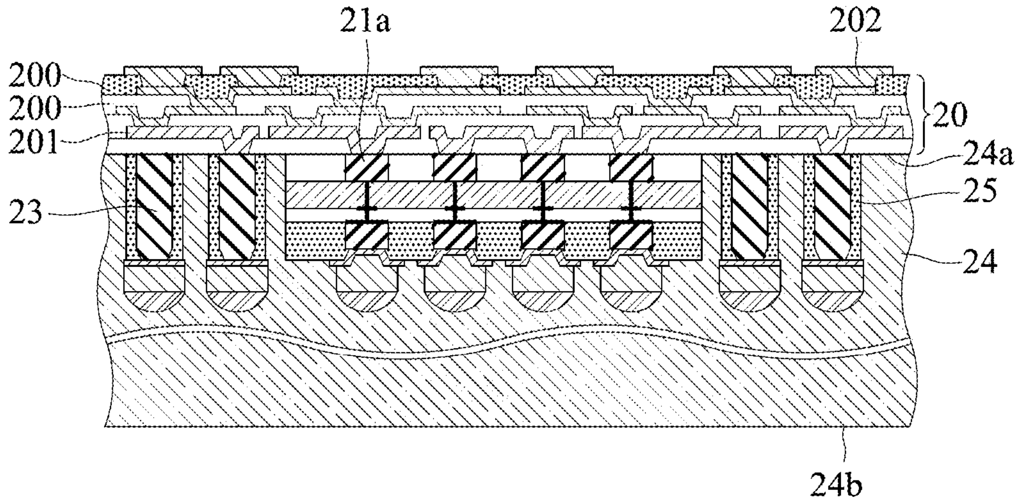

As shown in FIG. 2C, a circuit structure 20 is formed on the first side 24*a* of the carrier member 24, and the circuit structure 20 is electrically connected to the conductive pillars 23 and the first conductors 21*a*.

In one embodiment, the circuit structure 20 includes at least one insulating layer 200 and at least one circuit layer 201 formed on the insulating layer 200, such as of a redistribution layer (RDL) specification, wherein the outermost insulating layer 200 can be used as a solder-resist layer, and the outermost circuit layer 201 is exposed from the solder-resist layer to serve as electrical contact pads 202, such as micro pads (commonly known as μ-pads).

In addition, the material for forming the circuit layer 201 is copper, and the material for forming the insulating layer 200 is a dielectric material such as polybenzoxazole (PBO), polyimide (PI), prepreg (PP) and the like, or a solder-resist material such as solder mask (e.g., green solder mask), graphite (e.g., ink), etc.

Figure 2D:
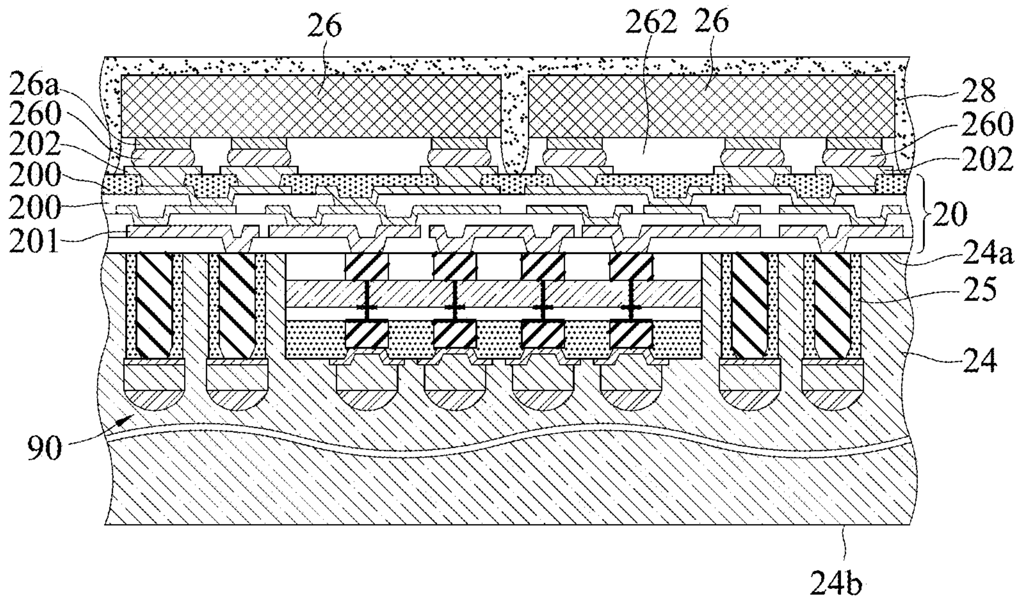

As shown in FIG. 2D, a plurality of second electronic elements 26 are disposed on the circuit structure 20, and then an encapsulation layer 28 is used to cover the second electronic elements 26.

The second electronic element 26 is an active element, a passive element, or a combination of the active element and the passive element, wherein the active element is, for example, a semiconductor chip, and the passive element is, for example, a resistor, a capacitor, or an inductor.

In one embodiment, the second electronic element 26 is, for example, a semiconductor chip such as a graphics processing unit (GPU) or a High Bandwidth Memory (HBM), and the present disclosure is not particularly limited to as such. For example, the first electronic element 2*a* serves as a bridge die and is electrically connected to the circuit structure 20 via the first conductors 21*a* to electrically bridge at least two second electronic elements 26.

Moreover, each of the second electronic elements 26 has a plurality of conductive bumps 26*a* such as copper blocks to electrically connect the electrical contact pads 202 via solder materials 260 of the plurality of solder bumps, and the encapsulation layer 28 can simultaneously cover the second electronic elements 26 and the conductive bumps 26*a*. For example, a UBM (not shown) can be formed on the electrical contact pad 202 to facilitate bonding with the conductive bump 26*a*.

The encapsulation layer 28 is made of insulating material, such as polyimide (PI), dry film, encapsulation colloid such as epoxy resin, or molding compound, and the encapsulation layer 28 can be formed on the circuit structure 20 by lamination or molding. It should be understood that the material for forming the encapsulation layer 28 may be the same as or different from the material of the cladding layer 25.

In one embodiment, an underfill 262 can be formed first between the second electronic elements 26 and the circuit structure 20 to cover the conductive bumps 26*a*, and then the encapsulation layer 28 is formed to cover the underfill 262 and the second electronic elements 26. Alternatively, the formation of the underfill 262 can be omitted, and the conductive bumps 26*a* and the second electronic elements 26 can be directly covered with the encapsulation layer 28.

Figure 2E:
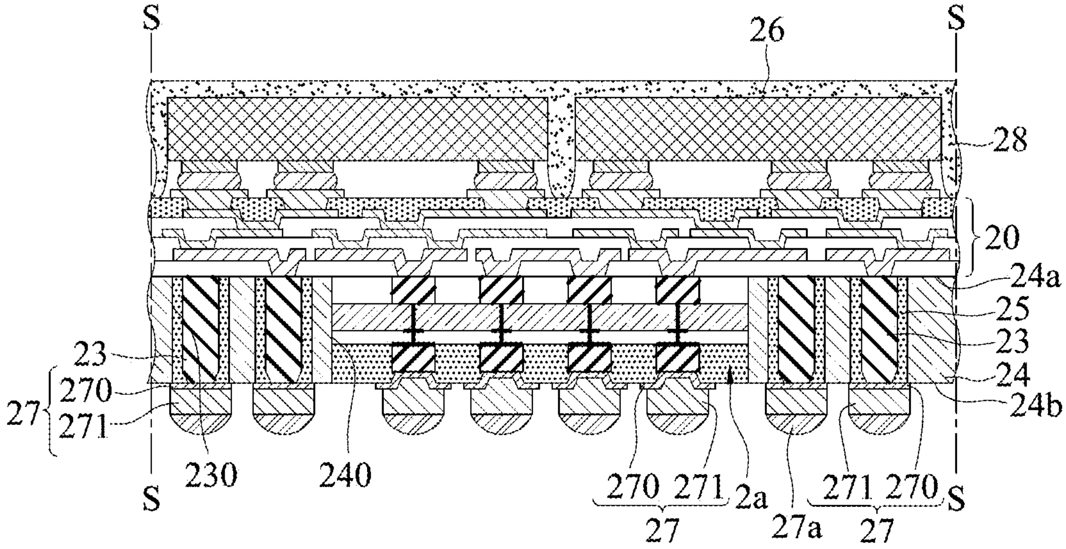

As shown in FIG. 2E, part of the material of the second side 24*b* of the carrier member 24 is removed to expose the conductive elements 27, and the groove 240 and the openings 230 communicate with the first side 24*a* and the second side 24*b*.

In one embodiment, part of the material of the second side 24*b* of the carrier member 24 is removed by etching or other methods.

Due to the design of the groove 240 not penetrating through the carrier member 24, the carrier member 24 still covers the first electronic element 2*a* after part of the material of the second side 24*b* of the carrier member 24 is removed, so that the first electronic element 2*a* is not exposed to the external environment (or air), thereby avoiding damage to the first electronic element 2*a*. In addition, the first electronic element 2*a* is disposed in the groove 240 of the carrier member 24 without a die attach film (DAF), thereby avoiding peeling and hole problems.

Figure 2F:
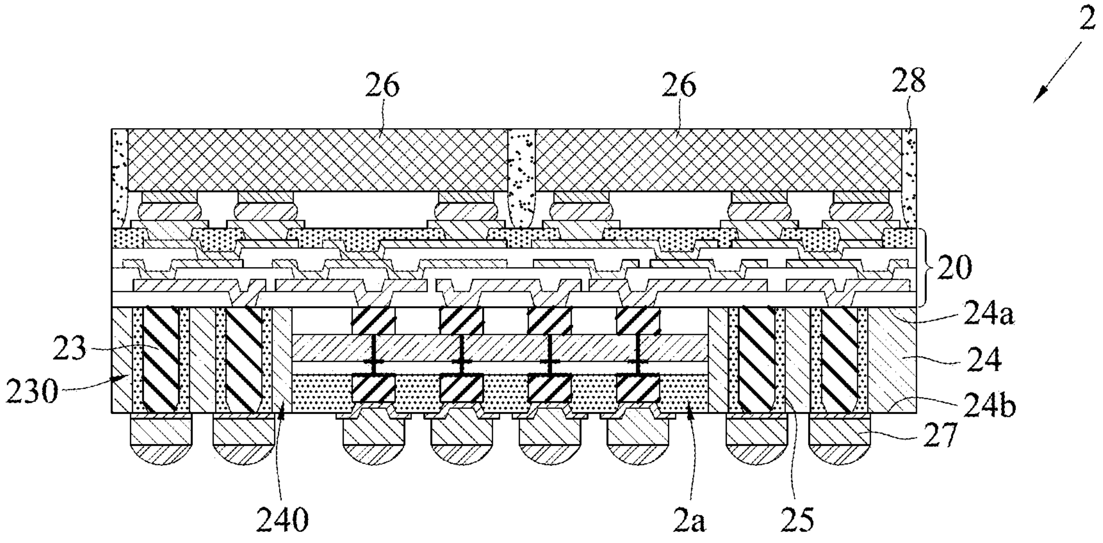

As shown in FIG. 2F, a singulation process is performed along a cutting path S shown in FIG. 2E to obtain a plurality of the electronic packages 2.

Subsequently, the electronic package 2 can be disposed on an electronic device (not shown) such as a circuit board via the conductive elements 27.

In addition, part of the material of the encapsulation layer 28 can be removed via a leveling process such as grinding, so that an upper surface of the encapsulation layer 28 is flush with upper surfaces of the second electronic elements 26, such that the second electronic elements 26 are exposed from the encapsulation layer 28.

Therefore, in the manufacturing method of the present disclosure, the board body made of semiconductor material is used as the carrier member 24 to cover the first electronic element 2*a*, so that the coefficient of thermal expansion (CTE) of the carrier member 24 matches the coefficient of thermal expansion of the first electronic element 2*a*, which is beneficial to dispersing thermal stress. Therefore, compared with the prior art, the present disclosure can prevent the carrier member 24 from warping during the thermal cycle, thereby avoiding the occurrence of reliability issues such as the electronic package 2 or the first electronic element 2*a* (even the second electronic elements 26) being broken, the ball condition being not good (that is, the conductive elements 27 falling and being electrically disconnected), the conductive elements 27 being non-wetting, or delamination of the circuit structure 20, etc., so as to improve the reliability of terminal electronic products (such as computers, mobile phones, etc.) applying the electronic package 2. In addition, the present disclosure provides the plurality of recesses 90 on the bottom surface of the groove 240 and the bottom surfaces of the plurality of openings 230 for subsequent formation of the conductive elements 27 in the plurality of recesses 90, thereby increasing the contact area of the conductive element 27 and solving problems such as detachment or cracking.

Moreover, the carrier member 24 is a hard structure made of silicon and is not prone to thermal deformation, so that the surface of the first side 24*a* can remain flat. Therefore, the circuit structure 20 of the present disclosure can be formed flatly on the carrier member 24, so that the circuit layer 201 can effectively connect the conductive pillar 23 and the first conductor 21*a*, thereby improving the electrical yield of the electronic package 2.

Furthermore, the wall surfaces of the openings 230 formed in the carrier member 24 have better flatness, so that better-structured vertical conductive lines, that is, the conductive pillars 23, can be obtained to improve the reliability of the product.

FIG. 3A to FIG. 3E are schematic cross-sectional views illustrating a manufacturing method of an electronic package 3 according to a second embodiment of the present disclosure. The difference between the second embodiment and the first embodiment lies in the omission of the recesses 90. Other manufacturing processes are roughly the same, so the similarities will not be described again.

Figure 3A:
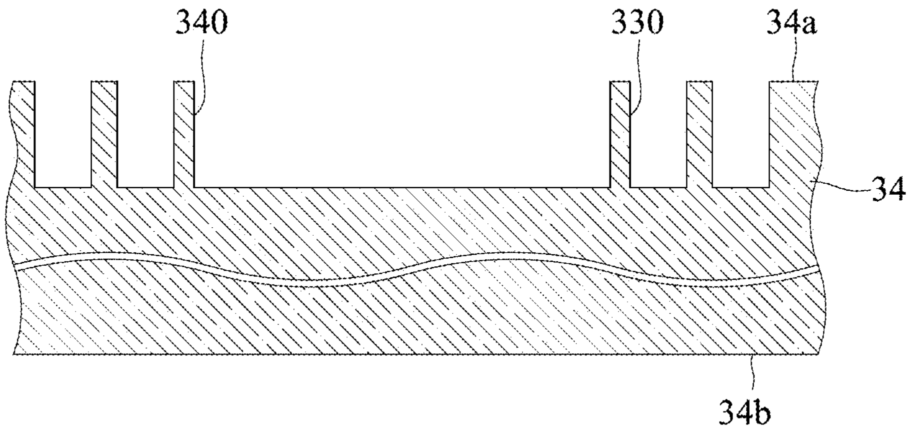
FIG. 3A to FIG. 3E are schematic cross-sectional views illustrating a manufacturing method of an electronic package according to a second embodiment of the present disclosure.

As shown in FIG. 3A, a carrier member 34 is provided, wherein the carrier member 34 has a first side 34*a* and a second side 34*b* opposing the first side 34*a*, and the carrier member 34 is provided with at least one groove 340 and a plurality of openings 330.

Figure 3B:
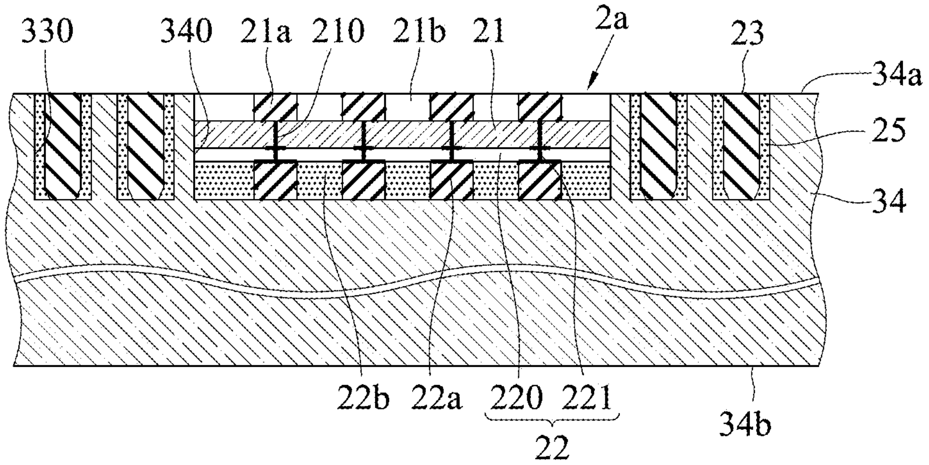

As shown in FIG. 3B, a plurality of conductive pillars 23 are formed in the plurality of openings 330, and at least one first electronic element 2*a* is accommodated in the groove 340.

Figure 3C:
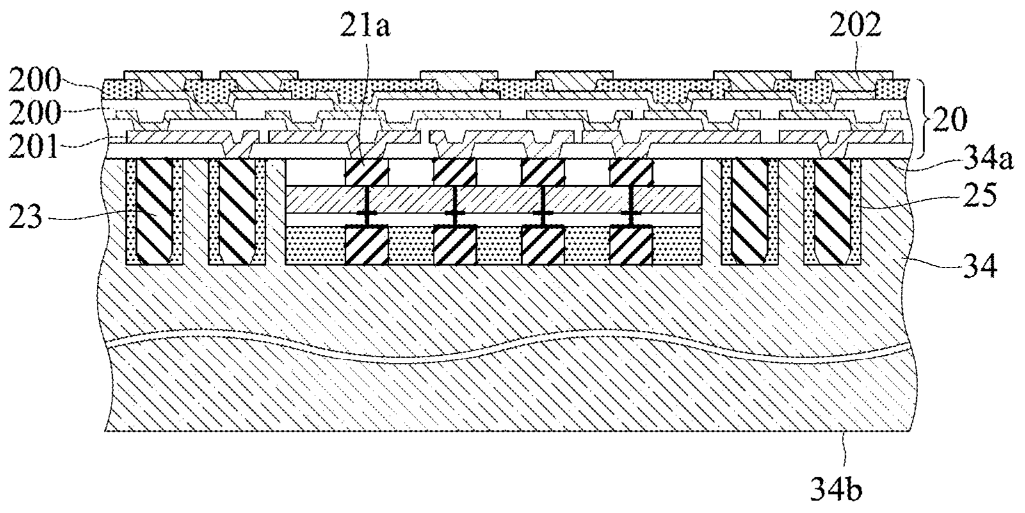

As shown in FIG. 3C, a circuit structure 20 is formed on the first side 34*a* of the carrier member 34, and the circuit structure 20 is electrically connected to the conductive pillars 23 and first conductors 21*a*.

Figure 3D:
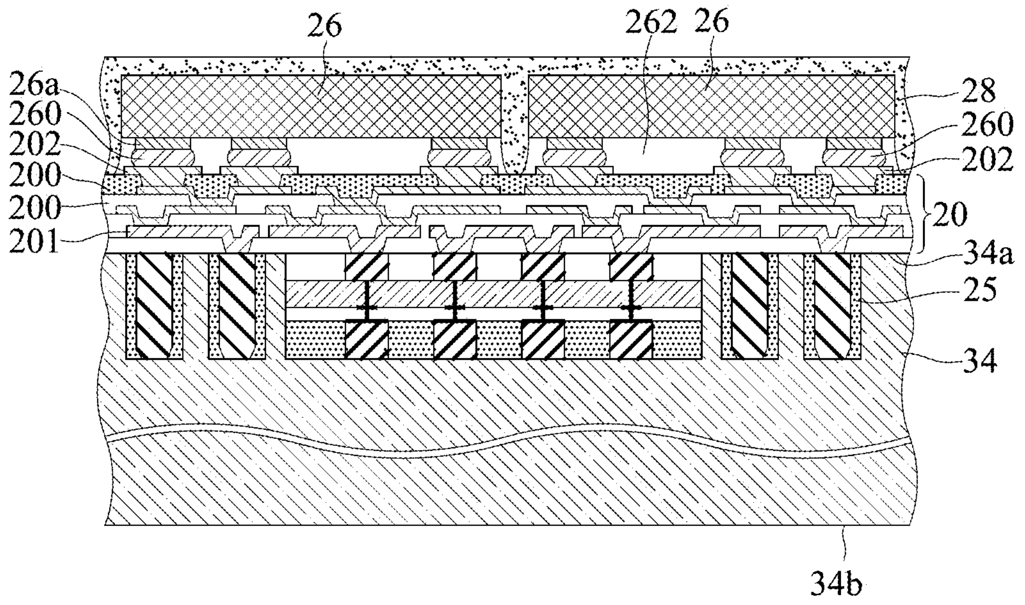

As shown in FIG. 3D, a plurality of second electronic elements 26 are disposed on the circuit structure 20, and then an encapsulation layer 28 is used to cover the second electronic elements 26.

Figure 3E:
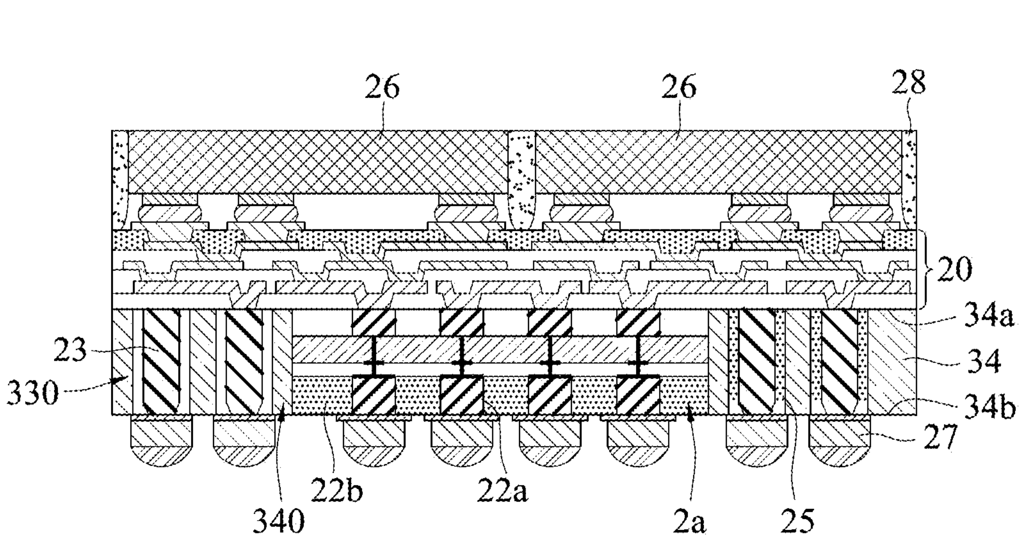

As shown in FIG. 3E, part of the material of the second side 34*b* of the carrier member 34 is removed to expose a second protective layer 22*b*, second conductors 22*a* and the conductive pillars 23, so that the groove 340 and the openings 330 communicate with the first side 34*a* and the second side 34*b*. Next, a plurality of conductive elements 27 are formed on the plurality of second conductors 22*a* and the plurality of conductive pillars 23. Afterwards, a singulation process is performed to obtain a plurality of the electronic packages 3.

The present disclosure also provides an electronic package 2, 3, which comprises: a carrier member 24, 34, at least one first electronic element 2*a*, a plurality of conductive pillars 23, a plurality of conductive elements 27, and a circuit structure 20.

The carrier member 24, 34 has a first side 24*a* and a second side 24*b* opposing the first side 24*a*, wherein the carrier member 24, 34 has at least one groove 240, 340 and a plurality of openings 230, 330, and the groove 240, 340 and the openings 230, 330 communicate with the first side 24*a*, 34*a* and the second side 24*b*, 34*b*.

The plurality of conductive pillars 23 are disposed in the plurality of openings 230, 330.

The first electronic element 2*a* is disposed in the groove 240, 340.

The conductive elements 27 are disposed on the second side 24*b*, 34*b* of the carrier member 24, 34 and electrically connected to the conductive pillars 23 and the first electronic element 2*a*.

The circuit structure 20 is disposed on the first side 24*a*, 34*a* of the carrier member 24, 34 and electrically connected to the conductive pillars 23 and the first electronic element 2*a*.

In one embodiment, the carrier member 24, 34 is a board body made of semiconductor material.

In one embodiment, the first electronic element 2*a* includes an electronic body 21 made of a silicon substrate.

In one embodiment, at least one second electronic element 26 is disposed on the circuit structure 20 and electrically connected to the circuit structure 20. Furthermore, the electronic package 2, 3 further includes an encapsulation layer 28 covering the second electronic element 26.

To sum up, in the electronic package and the manufacturing method thereof of the present disclosure, a board body made of semiconductor material serves as a carrier member, so that the coefficient of thermal expansion of the carrier member matches the coefficient of thermal expansion of the first electronic element, which is beneficial to dispersing thermal stress. Therefore, the present disclosure can prevent the carrier member from warping during the thermal cycle, thereby preventing the electronic package from being broken.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:

a carrier member having a first side and a second side opposing the first side, wherein the carrier member is a board body made of a semiconductor material and formed with a groove and a plurality of openings, and the groove and the plurality of openings communicate with the first side and the second side;

a plurality of conductive pillars disposed in the plurality of openings;

a first electronic element disposed in the groove;

a plurality of conductive elements disposed on the second side of the carrier member and electrically connected to the plurality of conductive pillars and the first electronic element; and a circuit structure disposed on the first side of the carrier member and electrically connected to the plurality of conductive pillars and the first electronic element.

2. The electronic package of claim 1, wherein the first electronic element includes an electronic body of a silicon substrate.

3. The electronic package of claim 1, further comprising at least one second electronic element disposed on and electrically connected to the circuit structure.

4. The electronic package of claim 3, further comprising an encapsulation layer covering the at least one second electronic element.

5. A method of manufacturing an electronic package, comprising:

providing a carrier member having a first side and a second side opposing the first side, wherein the carrier member is a board body made of a semiconductor material, the first side of the carrier member is formed with a groove and a plurality of openings, a bottom surface of the groove has a plurality of recesses, and each of the plurality of openings extends from the first side of the carrier member toward the second side and has a bottom surface provided with at least one recess;

forming a plurality of conductive elements in the plurality of recesses, forming a plurality of conductive pillars in the plurality of openings, and placing a first electronic element in the groove, wherein the plurality of conductive elements are electrically connected to the plurality of conductive pillars and the first electronic element;

forming a circuit structure on the first side of the carrier member, wherein the circuit structure is electrically connected to the plurality of conductive pillars and the first electronic element; and removing part of material on the second side of the carrier member to expose the plurality of conductive elements, wherein the groove and the plurality of openings communicate with the first side and the second side.

6. The method of claim 5, wherein the first electronic element includes an electronic body of a silicon substrate.

7. The method of claim 5, further comprising disposing at least one second electronic element on the circuit structure, wherein the at least one second electronic element is electrically connected to the circuit structure.

8. The method of claim 7, further comprising covering the at least one second electronic element with an encapsulation layer.

9. A method of manufacturing an electronic package, comprising:

providing a carrier member having a first side and a second side opposing the first side, wherein the first side of the carrier member is formed with a groove and a plurality of openings;

forming a plurality of conductive pillars in the plurality of openings, and placing a first electronic element in the groove;

forming a circuit structure on the first side of the carrier member, wherein the circuit structure is electrically connected to the plurality of conductive pillars and the first electronic element;

removing part of material of the second side of the carrier member to expose the conductive pillars and the first electronic element, wherein the groove and the plurality of openings communicate with the first side and the second side; and forming a plurality of conductive elements on the conductive pillars and the first electronic element, wherein the plurality of conductive elements are electrically connected to the plurality of conductive pillars and the first electronic element.

10. The method of claim 9, wherein the carrier member is a board body made of a semiconductor material.

11. The method of claim 9, wherein the first electronic element includes an electronic body of a silicon substrate.

12. The method of claim 9, further comprising disposing at least one second electronic element on the circuit structure, wherein the at least one second electronic element is electrically connected to the circuit structure.

13. The method of claim 12, further comprising covering the at least one second electronic element with an encapsulation layer.

* * * * *